(12) United States Patent
Takeuchi et al.

(10) Patent No.: US 6,512,182 B2
(45) Date of Patent: Jan. 28, 2003

(54) WIRING CIRCUIT BOARD AND METHOD FOR PRODUCING SAME

(75) Inventors: Hiroki Takeuchi, Aichi (JP); Toshifumi Kojima, Aichi (JP); Kazushige Obayashi, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/086,428

(22) Filed: Mar. 4, 2002

(65) Prior Publication Data
US 2002/0185303 A1 Dec. 12, 2002

(30) Foreign Application Priority Data
Mar. 12, 2001 (JP) .......................... 2001-068133

(51) Int. Cl.⁷ .............................. H05K 1/03; H05K 1/09
(52) U.S. Cl. ..................... 174/256; 174/255; 174/260; 29/841; 29/846; 361/761; 361/762
(58) Field of Search ................. 174/256, 260, 174/255; 301/760, 783, 762, 761, 763; 29/841, 832, 846

(56) References Cited

U.S. PATENT DOCUMENTS

| 5,290,197 A | * | 3/1994 | Ohuma et al. ............. 29/841 |
| 6,204,454 B1 | * | 3/2001 | Gotoh et al. ............. 174/255 |
| 6,370,013 B1 | * | 4/2002 | Lino et al. ................ 361/763 |

FOREIGN PATENT DOCUMENTS

| JP | 9-46046 | | 2/1997 |
| JP | 409107067 | * | 4/1997 |
| JP | 410261860 | * | 9/1998 |
| JP | 11-126978 | | 5/1999 |
| JP | 2000-124352 | | 4/2000 |

* cited by examiner

Primary Examiner—Albert W. Paladini
(74) Attorney, Agent, or Firm—Sughrue Mion, PLLC

(57) ABSTRACT

The invention relates to a wiring circuit board including an electronic device disposed in a hole of the wiring circuit board; a resin filling the hole such that the electronic device is embedded in the resin; a wiring layer formed on the resin; and an interface between the resin and the wiring layer. This interface has a roughness in a range of 2–6 μm in terms of ten-point mean roughness.

23 Claims, 9 Drawing Sheets

WIRING CIRCUIT BOARD AND METHOD FOR PRODUCING SAME

BACKGROUND OF THE INVENTION

The present invention relates to a wiring circuit board in which an electronic device (e.g., chip capacitor, chip inductor, and chip resistor) is embedded in its insulating substrate using an embedding resin for that. This type of wiring circuit board is suitable for multilayer wiring circuit boards and semiconductor-device-received packages.

In recent years, there have been studies of mutichip modules (MCM) in which many semiconductor devices are mounted on a buildup wiring circuit board. For mounting electronic devices (e.g., chip capacitor, chip inductor, and chip resistor), it is general to conduct a surface mounting in which the electronic devices are mounted on a wiring layer (formed on the surface of a substrate) by using a solder.

However, when such electronic devices are mounted on the surface of a buildup wiring circuit board, it is necessary to have a certain area for mounting each electronic device. Therefore, this becomes an obstacle in the way of producing smaller wiring circuit boards. Furthermore, the wiring arrangement upon the surface mounting may increase undesirable parasitic inductance. Therefore, to follow higher-frequency electronic apparatuses becomes difficult.

In order to solve the above-mentioned problems, there have been studies of embedding electronic devices in the inside of an insulating substrate.

Japanese Patent Unexamined Publication JP-A-11-126978 discloses a method for putting an electronic device in a hole of an insulating substrate. In this method, a laminate is prepared by forming a wiring circuit layer on a transfer film and then by mounting the electronic device on the wiring circuit layer. The resulting laminate is placed on the insulating substrate in a manner to put the electronic device into the hole. In this method, however, a precise positioning of the electronic device may be difficult. JP-A-2000-124352 discloses a multilayer wiring circuit board in which an insulating layer is formed on an electronic device embedded in a core substrate. JP-A-9-46046 discloses another multilayer wiring circuit board having an electronic device embedded therein.

SUMMARY OF THE INVENTION

In case that an electronic device is embedded in the inside of a core substrate, it is necessary to put the electronic device in a void space of the core substrate, then to fill the void space with a resin, and then to connect an electrode of the electronic device with a wiring by electroless plating or the like. In this case, it may be difficult to have a sufficient adhesion between the resin surface and a plating layer (wiring layer). This may cause a blister of the plating layer in a reliability test.

It is therefore an object of the present invention to provide a wiring circuit board that is capable of providing a superior adhesion of a wiring layer to a resin used for embedding an electronic device in the wiring circuit board.

It is another object of the present invention to provide a wiring circuit board that is substantially free from a blister of the wiring layer and has high reliabilities in reliability tests (e.g., heat shock resistance test and water resistance test).

According to the present invention, there is provided a wiring circuit board comprising:
- an electronic device disposed in a hole of said wiring circuit board;
- a resin filling said hole such that said electronic device is embedded in said resin;
- a wiring layer formed on said resin; and
- an interface between said resin and said wiring layer, said interface having a roughness in a range of 2–6 μm in terms of ten-point mean roughness.

According to the present invention, there is provided a method for producing the wiring circuit board. This method comprises the steps of:
(a) forming said hole in a core substrate of said wiring circuit board;
(b) disposing said electronic device in said hole;
(c) filling said hole with a resin, thereby embedding said electronic device in said resin;
(d) making a surface of said resin rough; and
(e) forming said wiring layer on said surface of said resin.

DESCRIPTION OF THE PREFERRED EMBODIMENTS

The inventors unexpectedly found that the resin is capable of sufficiently serving as an anchor for anchoring thereon the wiring layer by having a roughness of the interface in a range of 2–6 μm in terms of ten-point mean roughness (Rz), thereby substantially improving adhesion of the wiring layer to the resin and thereby maintaining flatness of the wiring layer and of a subsequent buildup layer formed on the wiring layer. Due to such flatness of the wiring layer, it is possible to obtain actual electric characteristics corresponding to simulation results of the design phase in producing wiring circuit boards. In contrast, if Rz is greater than 6 μm, the surface of the wiring layer becomes too rough. With this, it becomes difficult to obtain actual electric characteristics corresponding to simulation results of the design phase. If Rz is less than 2 μm, it becomes difficult to have the above-mentioned anchoring effect. With this, adhesion between the wiring layer (formed by plating) and the resin becomes too low. This may cause defects such as a blister of the wiring layer. Rz is preferably in a range of 2.5–5 μm. With this, it becomes possible to obtain a wiring circuit board with high reliability having a superior adhesion of the wiring layer and a sufficient flatness of the buildup layer.

The surface of the resin, having thereon the wiring layer, can be made rough by treating it with an oxidizing agent such as potassium permanganate or chromic acid. In this treatment, the resin component of the resin is oxidized and thereby dissolved and removed. Therefore, the after-mentioned inorganic filler of the resin comes out of the surface of the resin, thereby making the surface of the resin rough. This roughness serves as an anchor for anchoring the wiring layer (formed by plating) to the resin, thereby improving adhesion between the wiring layer and the resin. This lowers the occurrence of defects such as blisters.

Figure 26:
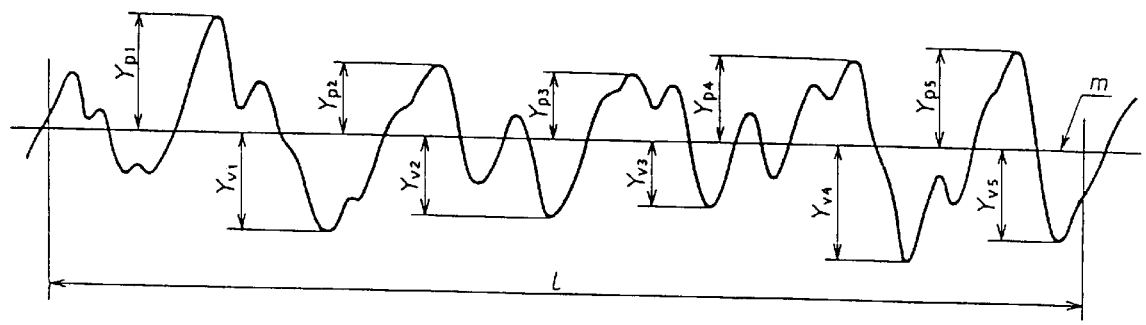
FIG. 26 is a sectional view schematically showing roughness of the interface in determining ten-point mean roughness (Rz).

It is important in the invention to determine ten-point mean roughness (Rz) of the interface between the resin and the wiring layer after the formation of the wiring layer, not Rz of the surface of the resin prior to the formation of the wiring layer. This is because the parameter that is directly indicative of the above-mentioned anchoring effect is not roughness of the surface of the resin prior to the formation of the wiring layer, but is roughness of the interface between the resin and the wiring layer under a condition that the wiring layer is anchored to the resin. If Rz of the surface of the resin prior to the formation of the wiring layer is used, it is necessary to count other factors (such as treatment for having hydrophilicity) in consideration of adhesion of the wiring layer. Therefore, such ten-point mean roughness (Rz) is not suitable as a parameter that is directly indicative of the above-mentioned anchoring effect. The reason why Rz is used as a parameter for evaluating roughness of the interface between the resin and the wiring layer is that it is possible to easily determine Rz from a photograph (taken by a scanning electron microscope (SEM) or the like) of a section of a final product. In other words, Rz is a parameter that is capable of directly evaluating roughness of the interface between the wiring layer and the resin of a final product. Rz is defined in Japanese Industrial Standard (JIS) B 0601. In fact, as shown in FIG. 26, Rz is determined by sampling only the reference length (1) from the roughness curve (of the interface) in the direction of its mean line (m). Rz is defined as being a sum of (1) an average value of absolute values of heights of five highest profile peaks ($Y_{p1}$ to $Y_{p5}$) and (2) an average value of absolute values of depths of five deepest profile valleys ($Y_{v1}$ to $Y_{v5}$) measured in the vertical magnification direction from the mean line (m) of the sampled portion. Therefore, Rz can be defined by the following expression.

$$R_z = |Y_{p1}+Y_{p2}+Y_{p3}+Y_{p4}+Y_{p5}| + |Y_{v1}+Y_{v2}+Y_{v3}+Y_{v4}+Y_{v5}|/5$$

The resin for filling the hole of the wiring circuit board may contain a resin component and at least one inorganic filler. This inorganic filler is capable of adjusting thermal expansion coefficient of the resin. Furthermore, it is capable of preventing deformation of (a) a three-dimensional structure of the resin after curing of the resin component and (b) a shape of the resin after making it rough. The inorganic filler content of the resin is in an amount of preferably 35–65 volume %, more preferably 40–60 volume %, still more preferably 40–50 volume %, in order to adjust the surface roughness of the resin after its roughness treatment. By adjusting ten-point mean roughness (Rz) of the interface in a range of 2–6 $\mu$m and by adjusting the inorganic filler content of the resin in an amount of 35–65 volume %, it is possible to more efficiently obtain the above-mentioned anchoring effect to get adhesion of the wiring layer to the resin, to maintain the shape of the resin after its roughness treatment, and to suppress the occurrence of potential defects (such as excessively large void spaces) under the wiring layer.

The inorganic filler used is not particularly limited. It can be selected from crystalline silica, fused silica, alumina, and silicon nitride. By containing the inorganic filler in the resin, it becomes possible to effectively lower thermal expansion coefficient of the resin. With this, it becomes possible to improve a final product in reliability against heat.

The inorganic filler is preferably made of particles having a particle size distribution in a range of 0.1–50 $\mu$m such that a space between electrodes of the electronic device is easily filled with the resin. If the particle size is greater than 50 $\mu$m, this space may be clogged with the inorganic filler. In other words, the degree of filling the resin component may become insufficient in this space. Thus, the final product may have a portion (caused by this insufficient filling of the resin component) having a thermal expansion coefficient that is substantially different from that of the rest of the final product. If the particle size is less than 0.1 $\mu$m, it may become difficult to maintain fluidity of the resin. The particle size distribution is in a range of more preferably 0.3–30 $\mu$m, still more preferably 0.5–20$\mu$m. It is preferable to have a relatively wide particle size distribution of the inorganic filler in order to lower viscosity of the resin and to higher the degree of the filling of the resin. It is preferable that the inorganic filler is generally spherical in shape in order to increase fluidity and the degree of the filling of the resin. It is preferable to use a silica-based inorganic filler, since it is easy to have a spherical shape.

According to need, it is optional to treat the surface of the inorganic filler with a coupling agent to conduct a surface treatment of the inorganic filler. With this, it is possible to improve (a) wettability of the inorganic filler relative to the resin component and (b) fluidity of the resin. The coupling agent may be selected from silane-based ones, titanate-based ones, and aluminate-based ones.

In view of fluidity of the resin, its resin component is preferably a thermosetting resin that is at least one selected from liquid-type epoxy resins (i.e., bisphenol epoxy resins and naphthalene-based epoxy resins) and phenol-novolak resins. If the resin is inferior in fluidity, a void space between electrodes of the electronic device may become insufficiently filled with the resin, thereby causing an uneven thermal expansion coefficient distribution in the final product. In particular, the resin component is preferably a naphthalene-based epoxy resin in view of adhesion strength, heat resistance, and humidity resistance.

The resin may contain an acid anhydride as a curing agent for curing the resin component, thereby further lowering viscosity of the liquid-type epoxy resin. Due to such low viscosity, it becomes possible to increase the amount of the inorganic filler and/or another filler, which is required for lowering thermal expansion coefficient of the resin, to have a higher degree of filling. Furthermore, fluidity of the resin is increased. Therefore, it is possible to increase the degree of filling of a void space (defined between electrodes of the electronic device) with the resin. The resin may further contain a curing accelerator (e.g., an imidazole-based one) for accelerating curing of the resin component. With this, it is possible to improve heat resistance and the like.

As stated above, the resin may contain (a) a thermosetting resin (as a resin component) that is at least one selected from bisphenol epoxy resins, naphthalene-based epoxy resins, and phenol-novolak resins; (b) a curing agent (containing an acid anhydride as its component) for curing the thermosetting agent; and 35–65 volume % of at least one inorganic filler. It is possible to produce a wiring circuit board by using such resin. With this, it is possible to improve adhesion strength of the wiring layer to the resin. Furthermore, it is possible to obtain higher reliabilities in reliability tests such as heat shock resistance test and water resistance test.

Figure 1:
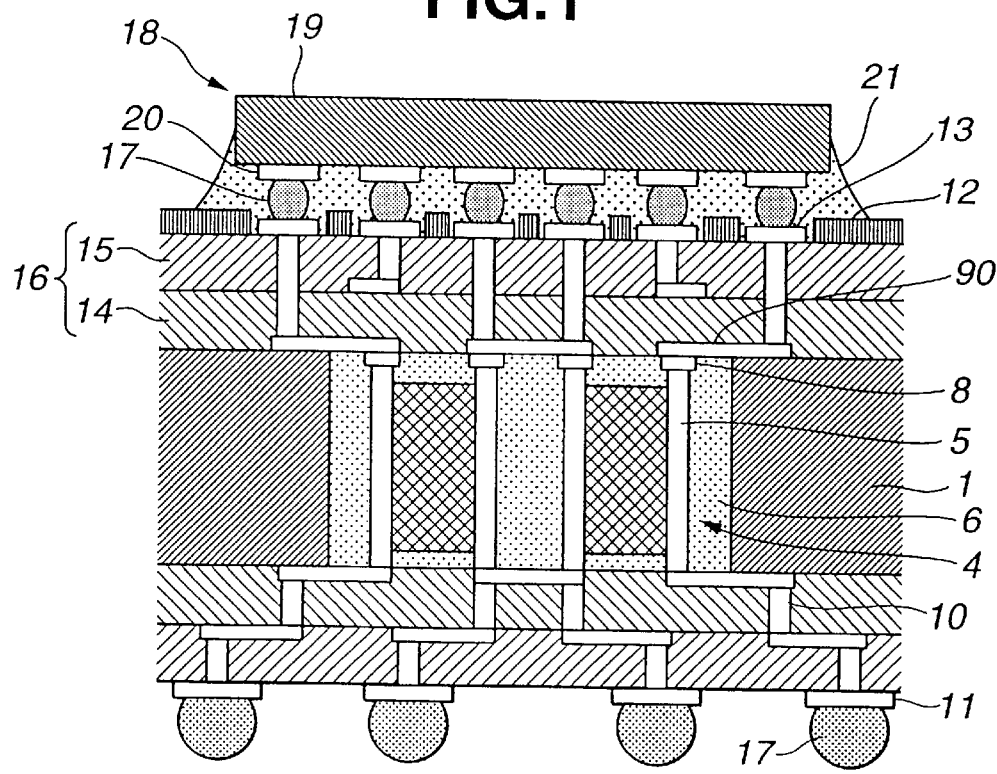
FIG. 1 is a side sectional view showing a BGA substrate having a wiring circuit board according to the present invention.
Figure 2:
FIGS. 2–9 are sectional sequential views showing a method for producing wiring circuit board according to the present in invention.
Figure 10:
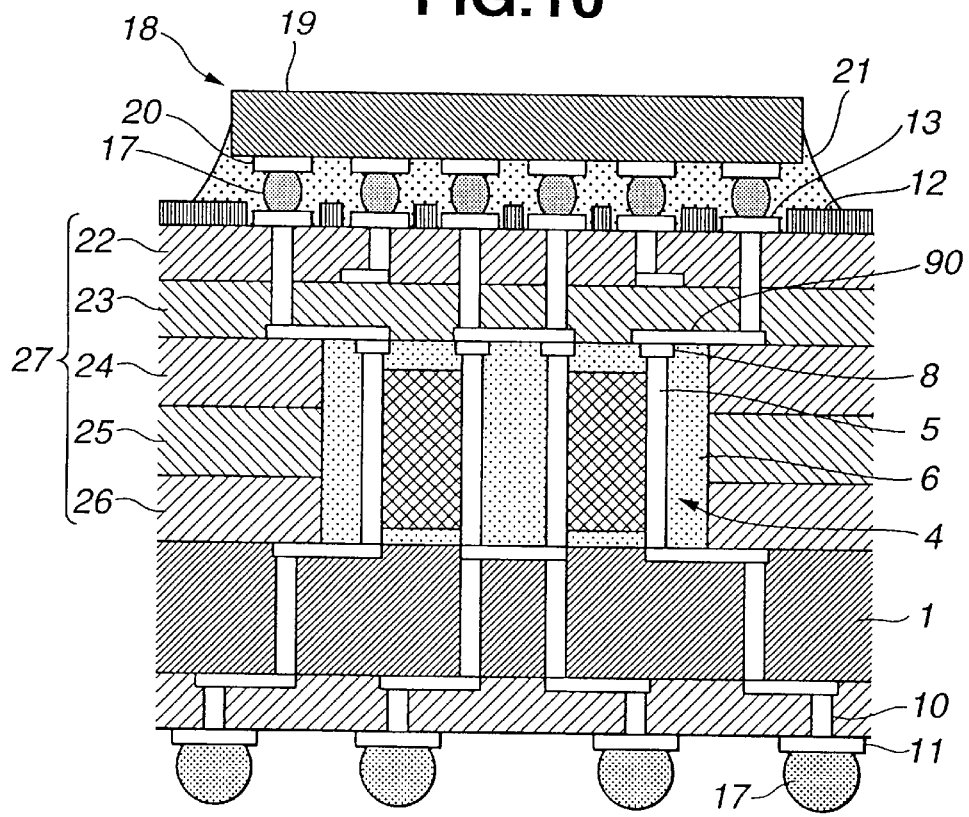
FIG. 10 is a side sectional view showing another BGA substrate having a wiring circuit board according to the present invention.

A wiring circuit board according to the present invention may contain a core substrate (e.g., FR-4, FR-5 and BT) including the hole (for disposing therein the electronic device) that passes through the core substrate. Furthermore, it is optional to use a core substrate prepared by sandwiching a copper foil (thickness: about 35 μm) between thermoplastic resin sheets (e.g., of PTFE), followed by forming a hole for disposing therein the electronic device. This hole may be (a) a through hole formed by punching the core substrate or (b) a cavity formed by a multilayering technique. Furthermore, it is optional to form a buildup layer on at least one side of the core substrate. This buildup layer is formed of at least one insulating layer and at least one wiring layer that are alternately stacked together. This buildup layer overlaps with the hole, which passes through the core substrate, in a direction along which the buildup layer is formed on the at least one side of the core substrate. In this case, it is possible to make the thickness of a glass-epoxy composite material (insulating substrate) thin from 800 μm of ordinary products to about 400 μm, even in the case of a capacitor-built-in multilayer wiring board shown in FIG. 11. As other examples, it is possible to form a wiring circuit board (as shown in FIG. 1) having an electronic device embedded in its core substrate. Furthermore, it is possible to form a wiring circuit board (as shown in FIG. 10) having an electronic device embedded in its buildup layer.

Figure 3:
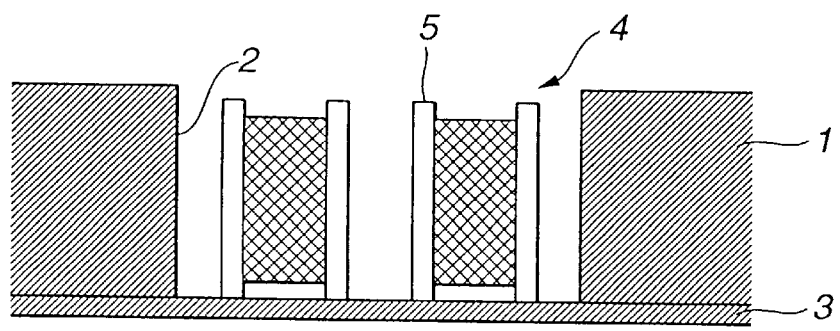

With reference to FIGS. 1–9, an exemplary method for producing a wiring circuit board according to the present invention will be described in the following. FIG. 1 shows a target product of this method, that is, BGA (ball grid array) wiring substrate having a wiring circuit board according to the present invention. In this method, as is seen from FIG. 2, a core substrate 1 is punched by a press to form a through hole 2 of a predetermined shape. Then, a back tape 3 is attached to one side of the core substrate 1 in order to prevent a resin from leaking. Then, the core substrate 1 is disposed in a manner that the back tape 3 is under the core substrate proper. Then, as is shown in FIG. 3, electronic devices 4 are placed at their predetermined positions on the back tape 3 in the through hole 2 from the other side of the back tape 3 using a chip mounter.

Figure 4:
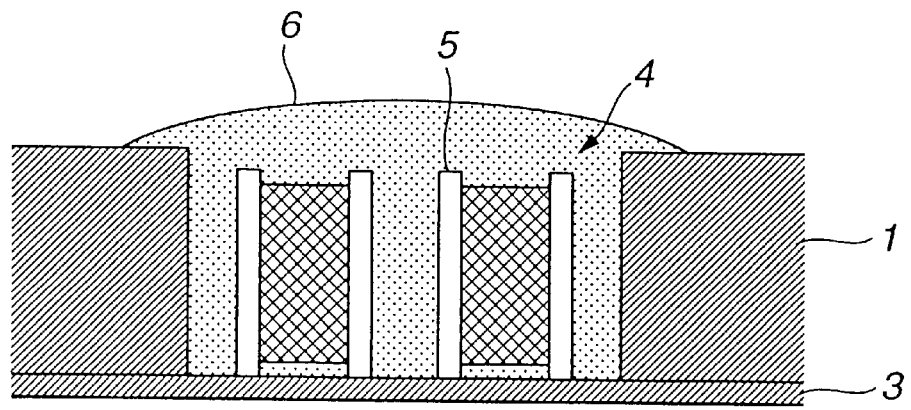

Then, as shown in FIG. 4, the hole 2 is filled with a filling resin 6 having a chemical composition suitable for the present invention. If this filling resin 6 contains an epoxy resin as its resin component, the core substrate may be heated at a temperature of 110–180° C. for curing the filling resin 6. This curing may be conducted by a first heating step at a temperature that is not lower than 80° C. and is lower than 120° C. and then by a second heating step at a temperature that is not lower than 120° C. and is not higher than 180° C. By conducting the first heating step, it is possible to efficiently remove bubbles existing in the resin (for example, bubbles existing in a space between the electronic device 4 and a peripheral wall of the hole 2 and existing between electrodes of the electronic device). It is difficult to remove these bubbles at room temperature. Thus, it is possible to conduct the second heating step under a condition free from such bubbles. It is optional to change the temperature stepwise in the first and/or second heating step. For example, it is possible to conduct the first heating step (at 100° C. for 80 minutes) and then the second heating step (at 120° C. for 60 minutes and then at 160° C. for 10 minutes).

Figure 5:
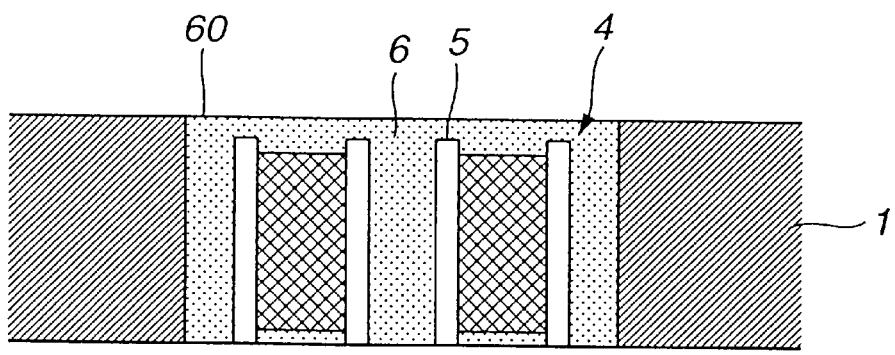
Figure 6:
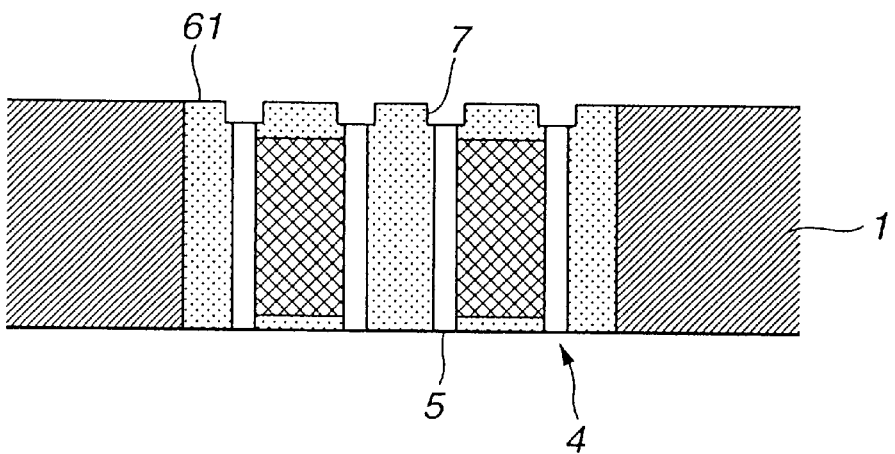

Then, as shown in FIG. 5, the surface of the cured resin 6 is made flat by a rough grinding with a belt sander and then by a finish grinding through lapping to form a flat surface 60 of the cured resin 6. Then, as shown in FIG. 6, a portion of the cured resin is removed by irradiating it with a carbon dioxide laser or YAG laser, thereby exposing electrodes 5 of the electronic devices 4 and forming via holes 7 for conducting electricity. In other words, these via holes 7 are formed to provide a wiring from the electrodes 5.

Then, the flat surface 60 of the cured resin 6 is made rough by treating the flat surface 60 with an oxidizing agent. This oxidizing agent can be selected from known oxidizing agents such as permanganic acid and its derivatives (e.g., $KMnO_4$ and $HMnO_4$), chromic acid and its derivatives (e.g., $CrO_3$, $K_2Cr_2O_7$, $K_2CrO_4$, $KCrO_3Cl$, and $CrO_2Cl_2$), nitric acid and its derivatives (e.g., $HNO_3$, $N_2O_4$, $N_2O_3$, $N_2O$, $Cu(NO_3)_2$, $Pb(NO_3)_2$, $AgNO_3$, $KNO_3$, and $NH_4NO_3$), halogens (e.g., $F_2$, $Cl_2$, $Br_2$, and $I_2$), peroxides (e.g., $H_2O_2$, $Na_2O_2$, $BaO_2$, and $(C_6H_5CO)_2O_2$), peracids (e.g., $Na_2S_2O_8$, $Na_2SO_5$, $K_2S_2O_8$, $K_2SO_5$, $HCO_3H$, $CH_3CO_3H$, $C_6H_5CO_3H$, $C_6H_4(COOH)CO_3H$, and $CF_3CO_3H$), sulfuric acid and its analogues (e.g., heated concentrated sulfuric acid and a mixture of fuming sulfuric acid and concentrated nitric acid), oxygen acids (e.g., KClO, NaClO, KBrO, NaBrO, KIO, NaIO, $KClO_3$, $NaClO_3$, $KBrO_3$, $NaBrO_3$, $KIO_3$, $NaIO_3$, $KClO_4$, $NaClO_4$, $KBrO_4$, $NaBrO_4$, $KIO_4$, $NaIO_4$, $HIO_4$, and $Na_3H_2IO_6$), metal salts (e.g., $FeCl3$, $CuSO_4$, $Cu(CH_3COO)_2$, $CuCl_2$, $Hg(CH_3COO)_2$, $Bi(CH_3COO)_3$, and $Pb(CH_3COO)_4$), oxygen and its analogues (e.g., air, oxygen, and ozone), oxides (e.g., $CeO_2$, $Ag_2O$, CuO, HgO, $PbO_2$, $Bi_2O_3$, $OsO_4$, $RuO_4$, $SeO_2$, $MnO_2$, and $As_2O_5$), and mixtures of these. In particular, it is preferable to use a mixture of an alkali and permanganic acid and its derivatives, a mixture of chromic acid (including its derivatives) and sulfuric acid (including its derivatives), or a mixture of chromic acid (including its derivatives), sulfuric acid (including its analogues) and sodium fluoride, or a mixture of borofluoric acid and dichromate, in order to make the filling resin (containing an epoxy resin as its main component) rough.

By the roughing treatment, a component of the filling resin is dissolved by the oxidizing agent, thereby forming a minute roughness on the surface of the filling resin. This roughness makes it possible to anchor a wiring layer (formed by an electroless plating or electroplating) to the filling resin.

Figure 7:
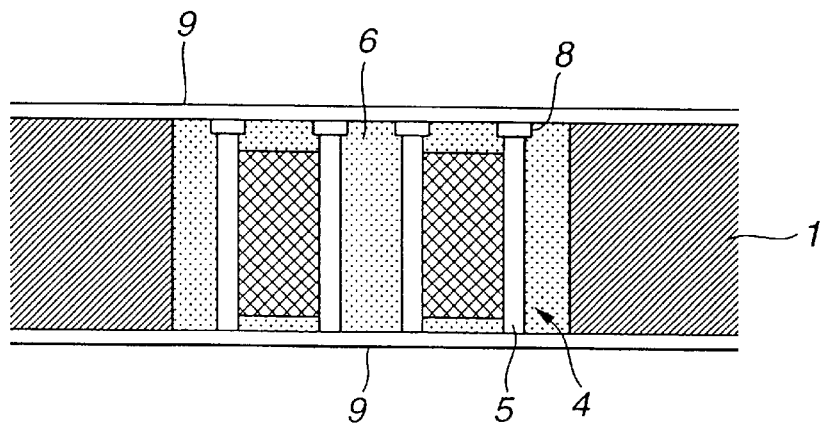
Figure 8:
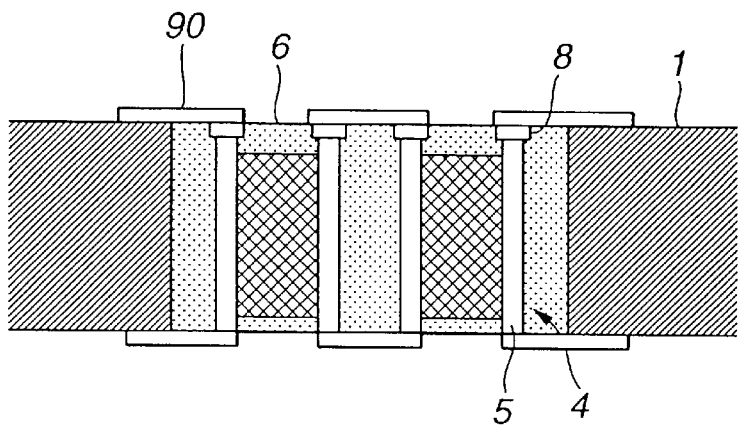
Figure 9:
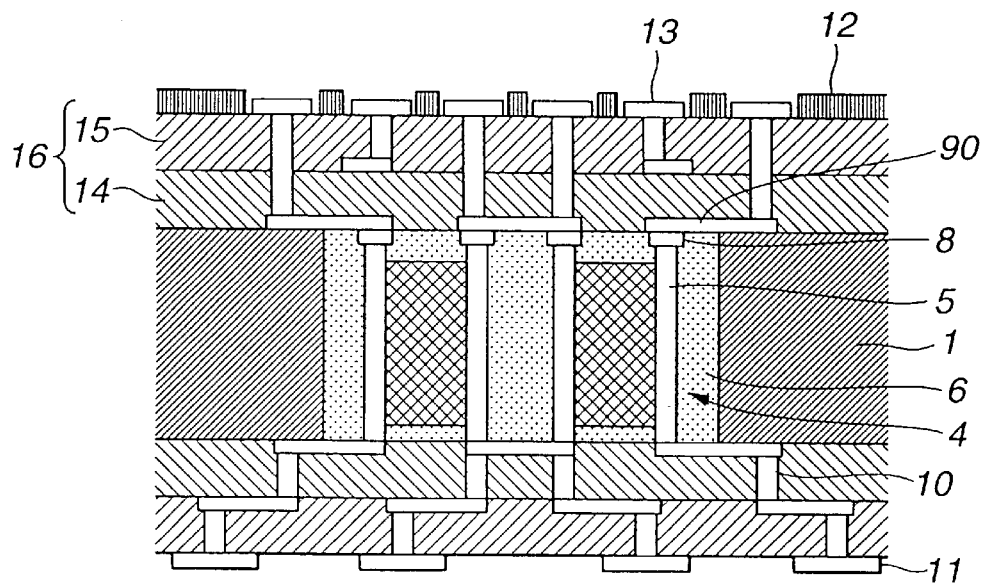

The rough surface 61 of the filling resin can be activated with a chemical liquid containing palladium chloride, followed by an electroless copper plating. Then, as shown in FIG. 7, a panel plating layer 9 is formed by a copper electroplating. With this, each via hole 7 is filled with copper, thereby forming a via conductor 8 for providing an electric connection with the electrodes of the electronic devices 4. Then, a dry film is attached on the panel plating layer 9, followed by forming a predetermined wiring pattern through exposure and development. In fact, an unnecessary portion of the panel plating layer 9 is removed by using an etching liquid containing $Na_2S_2O_8/H_2SO_4$, thereby forming a wiring layer 90 of a predetermined pattern (see FIG. 8). After that, as shown in FIG. 9, a multilayered structure may be formed according to need by using a known buildup technique, thereby forming a BGA substrate shown in FIG. 1. This BGA substrate is formed on its land pads 11 with solder balls 17 used for mounting a printed circuit board (PCB). Furthermore, a solder paste is printed on mounting pads 13, followed by forming solder bumps 17 thereon by solder reflow. Solder resists 12 are formed on one side (for mounting thereon a semiconductor device 18) of the wiring circuit board in order to prevent a short circuit between terminal electrodes 20 of the semiconductor device 18 caused by a leaked solder. The semiconductor device 18 are connected to the solder bumps 17 through the terminal electrodes 20. A mounting portion for mounting the semiconductor device 18 is filled with an underfill material 21.

Figure 11:
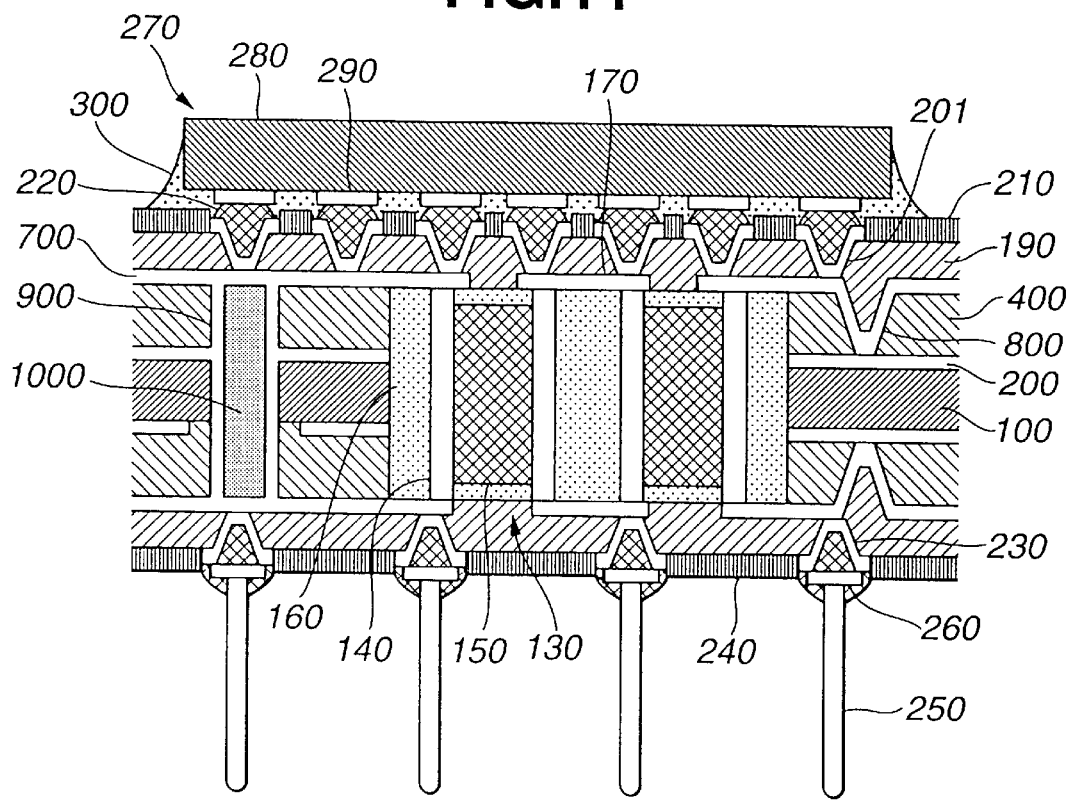
FIG. 11 is a semiconductor device having a FC-PGA-type multilayer printed circuit board according to the present invention.

With reference to FIGS. 11–25, another exemplary method for producing a wiring circuit board according to the present invention will be described in the following. FIG. 11 shows a target product of this method, that is, a FC-PGA-type multilayer printed circuit board having a buildup layer prepared by alternately laminating insulating layers and wiring layers.

Figure 12:
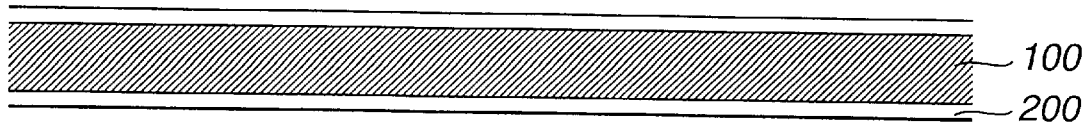
FIGS. 12–25 are sectional sequential views showing a method for producing the FC-PGA-type multilayer printed circuit board of FIG. 11.
Figure 13:
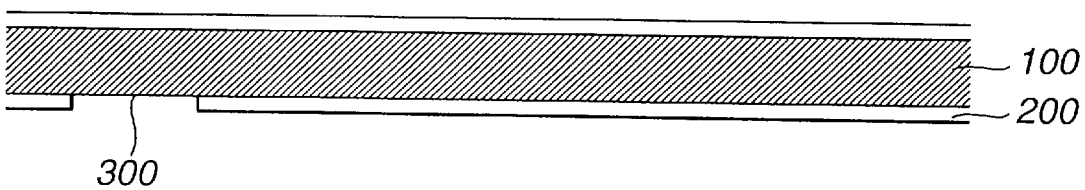

In this method, as is seen from FIG. 12, a core substrate is prepared. This core substrate is a sandwich structure having an insulating substrate 100 (thickness: 0.4 mm) of FR-5 sandwiched between two copper foils 200 each having a thickness of 18 $\mu$m. This core substrate has a glass transition point (Tg) of 175° C. in a thermomechanical analysis (TMA), a coefficient of thermal expansion (CTE) of 16 ppm/° C. in a direction along the substrate surface, a CTE of 50 ppm/° C. in a direction perpendicular to the substrate surface, a dielectric constant ($\in$) of 4.7 at 1 MHz, and a tan $\delta$ of 0.018 at 1 MHz.

Then, a photoresist film is attached to the core substrate, followed by exposure and development to form a first opening (diameter: 600 $\mu$m) and a second opening (not shown in the drawings) corresponding to a predetermined wiring pattern. Then, the exposed copper foil through the first and second openings is removed by using an etching liquid containing sodium sulfite and sulfuric acid, thereby forming a first exposed portion 300 (see FIG. 13) and a second exposed portion (not shown in the drawings) corresponding to the predetermined wiring pattern.

Then, the surface of each copper foil 200 is made rough through an etching treatment using a commercial etching treatment apparatus (CZ treatment apparatus of Meck Co.). After that, insulating films 400 (thickness: 35 $\mu$m) containing an epoxy resin as its main component are attached to both surfaces of the core substrate, followed by curing of the insulating films at 170° C. for 1.5 hr. The cured insulating films 400 have a glass transition point (Tg) of 155° C. in a thermomechanical analysis (TMA), a glass transition point (Tg) of 204° C. in DMA, a CTE of 66 ppm/° C., a dielectric constant ($\in$) of 3.7 at 1 MHz, and a tan $\delta$ of 0.033 at 1 MHz, a weight reduction of −0.1% at 300° C., a water absorption of 0.8%, a moisture absorption of 1%, a Young's modulus of 3 GHz, a tensile strength of 63 MPa, and an elongation of 4.6%.

Figure 14:
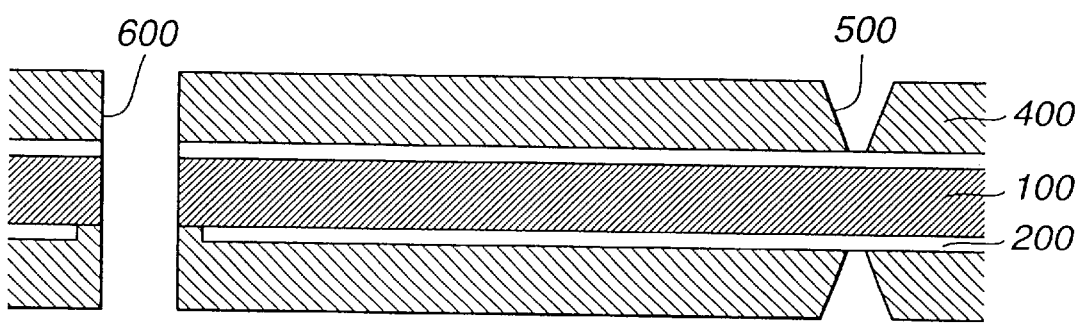

Then, as shown in FIG. 14, via holes 500 (for providing a layer-to-layer connection) are formed through the insulating layers 400 using a carbon dioxide laser. Each via hole 500 has a truncated cone shape having a surface larger diameter of 120 $\mu$m and a bottom smaller diameter of 60 $\mu$m. Then, a through hole (diameter: 300 $\mu$m) is formed by increasing output of the carbon dioxide laser such that the through hole passes through the insulating layers 400 and the core substrate. The inner wall surface of the through hole 600 has a waviness (not shown in the drawings) characteristic of a laser beam machining. The resulting substrate is immersed in a catalytically activating liquid containing palladium chloride, followed by applying an electroless copper plating (not shown in the drawings) to all the surface of the substrate.

Figure 15:
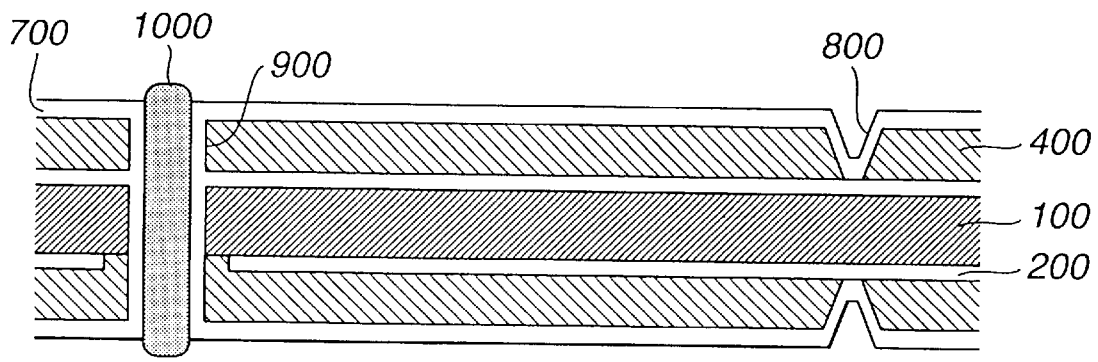

Then, as shown in FIG. 15, a copper panel plating 700 (thickness: 18 $\mu$m) is formed on all the surface of the substrate, thereby forming (a) a via hole conductor 800 for achieving a layer-to-layer electrical connection and (b) a through hole conductor 900 for achieving an electrical connection between the front and back surfaces of the substrate. Then, the surface of the copper plating is made rough by conducting an etching treatment using a commercial etching treatment apparatus (CZ treatment apparatus of Meck Co.). After that, the substrate is subjected to an anticorrosive treatment (CZ treatment) using an anticorrosive agent of Meck Co., thereby forming hydrophobic surfaces and completing a hydrophobicity treatment. After this hydrophobicity treatment, the contact angle 2$\theta$ of a water drop on the surface of the conductor layer (the copper panel plating) was measured by using a contact angle measuring apparatus (CA-A (trade name) of Kyowa Kagaku Co.). The result was 101 degrees.

Then, the substrate is disposed on a non-fibrous paper, which is previously placed on a base equipped with a vacuum suction apparatus. Then, a stainless steel mask for filling the through hole of the substrate is set on the substrate. This mask has a through hole corresponding to the position of the through hole of the substrate. Then, the through hole of the substrate is filled with a paste containing a copper filler by pressing a roller-type squeegee (see FIG. 15).

Figure 16:
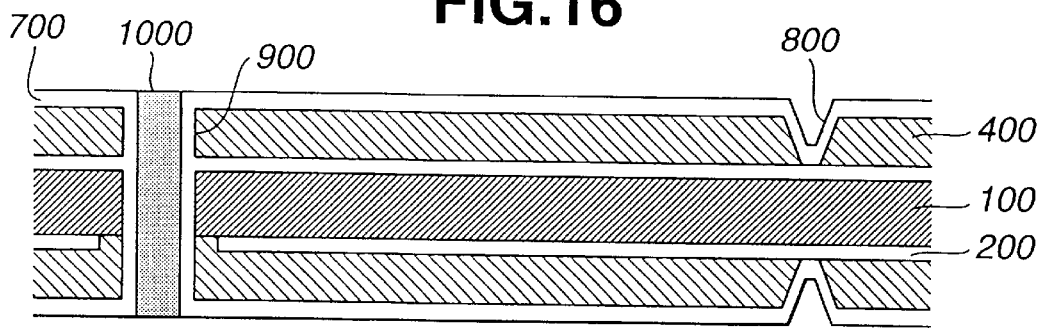

Then, as shown in FIG. 15, the paste 1000 filling the through hole is subjected to a preliminary curing at 120° C. for 20 minutes. Then, as shown in FIG. 16, the core substrate surfaces are subjected to a rough grinding by a belt sander and then to a buffing (finish grinding), thereby making them flat. After that, the core substrate is subjected to a curing at 150° C. for 5 hr, thereby completing a hole filling step. A portion of the core substrate after the completion of this hole-filling step is used in a test for evaluating a condition in which the through hole is filled with the paste.

Figure 17:
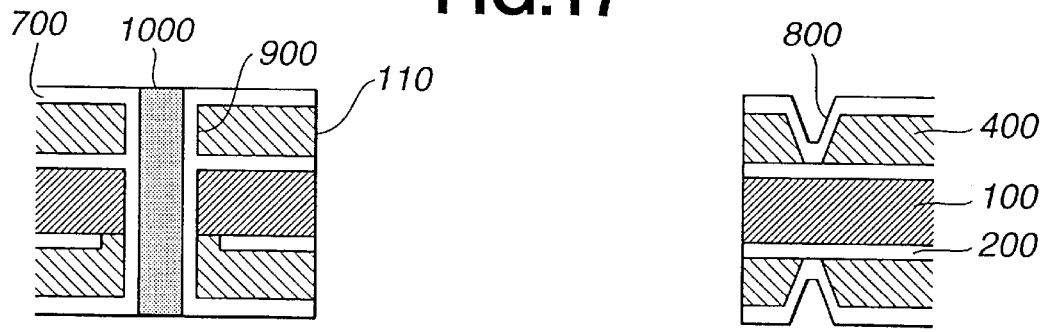
Figure 18:
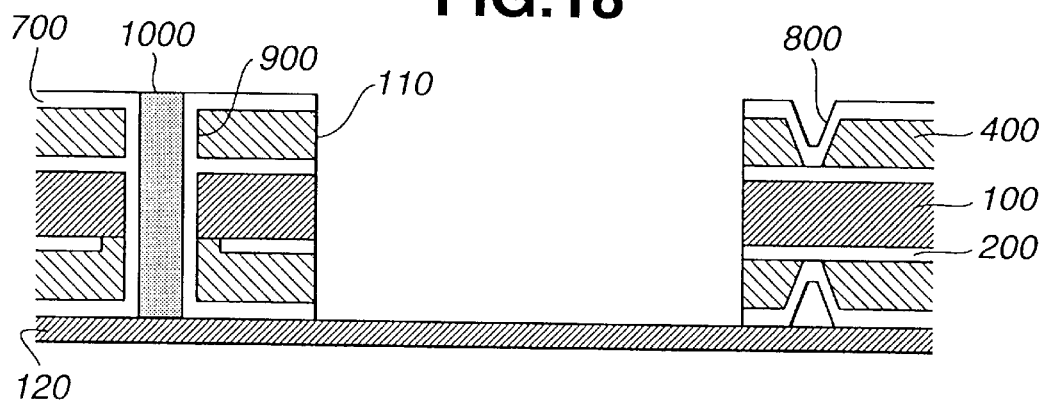
Figure 19:
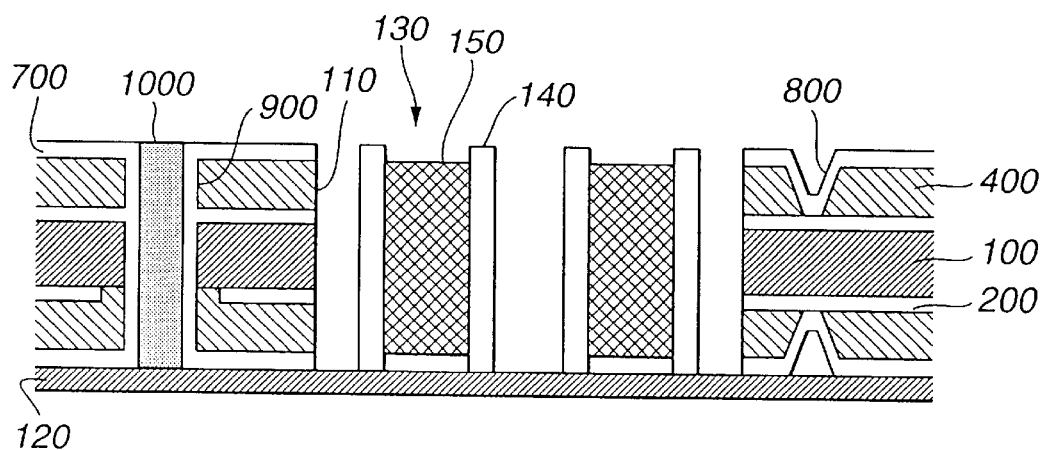

Then, as shown in FIG. 17, a through hole 110 (widths: 8 mm) is formed through the core substrate by using a mold. Then, as shown in FIG. 18, a masking tape 120 is attached to a portion of the substrate. Then, as shown in FIG. 19, stacked chip capacitors 130 (eight capacitors) are disposed on the masking tape 120. Each capacitor 130 is formed of a stacked member 150 (dimensions: 1.2 mm, 0.6 mm and 0.4 mm) and electrodes 140 projecting from the top surface of the stacked member 15 by 70 $\mu$m.

Figure 20:
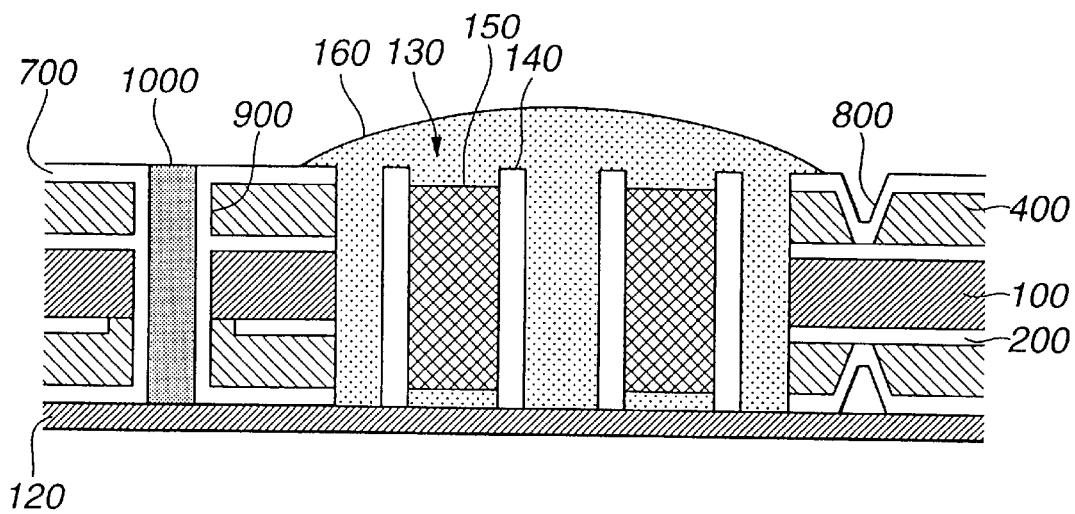

Then, as shown in FIG. 20, a void space of the through hole 110 is filled with a filling resin according to the present invention by using a dispenser. Then, the filling resin is cured at 80° C. for 3 hr and then at 170° C., for 6 hr, thereby conducting defoaming and thermosetting.

Figure 21:
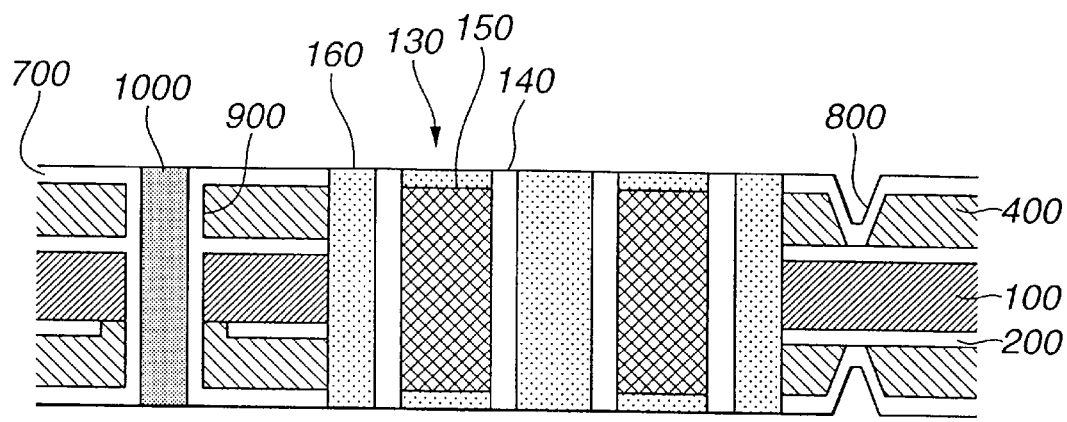

Then, as shown in FIG. 21, the surface of the cured resin is subjected to a rough grinding using a belt sander and then a finish grinding (lapping), thereby exposing the top surface of each electrode 140 of the chip capacitors 130. Then, the preliminarily cured resin is cured at 150° C. for 5 hr.

Figure 22:
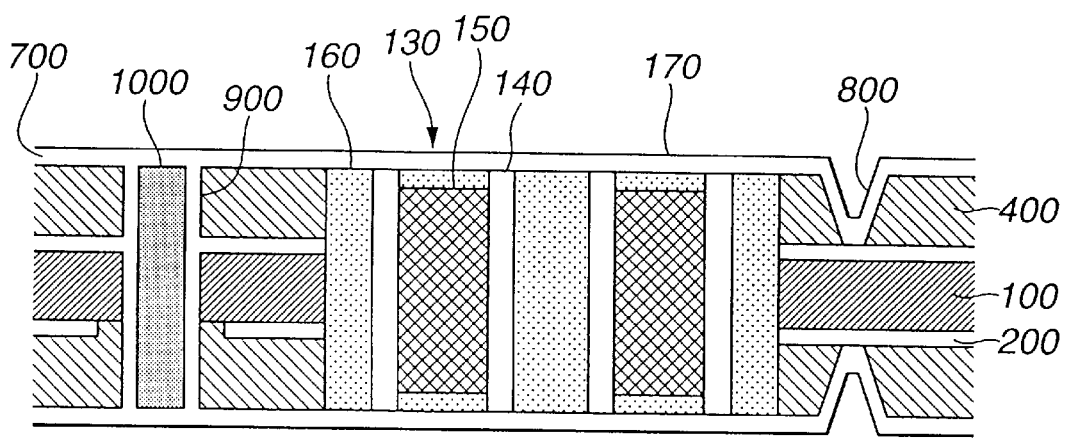
Figure 23:
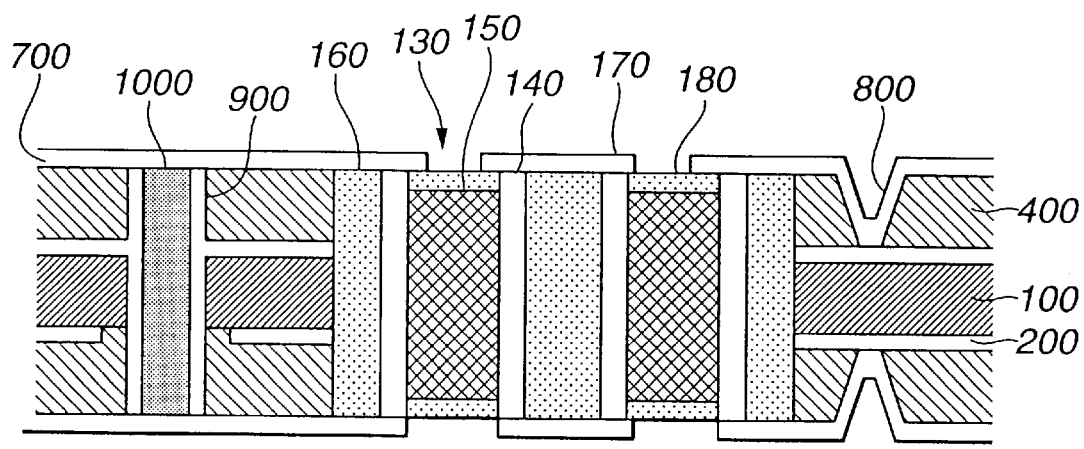

Then, the surface of the resin is made rough by using a swelling liquid and $KMnO_4$ solution such that an interface between the resin and a subsequent plating layer thereon has a roughness of 2–6 $\mu$m in terms of ten-point mean roughness. After that, the surface of the resin is subjected to a Pd catalyst activation, then copper electroless plating, and then copper electroplating. As shown in FIG. 22, the resulting plating layer is electrically connected to the top surfaces of the electrodes of the chip capacitors 130. Then, a resist is formed on the plating layer, followed by removing an unnecessary portion of the copper plating layer using an etching solution ($Na_2S_2O_8$ and concentrated sulfuric acid) and then removing the remaining resist, thereby forming a predetermined wiring pattern shown in FIG. 23. After that, the surface of this copper wiring layer is made rough by an etching treatment using a commercial etching treatment apparatus (CZ treatment apparatus of Meck Co.).

Figure 24:
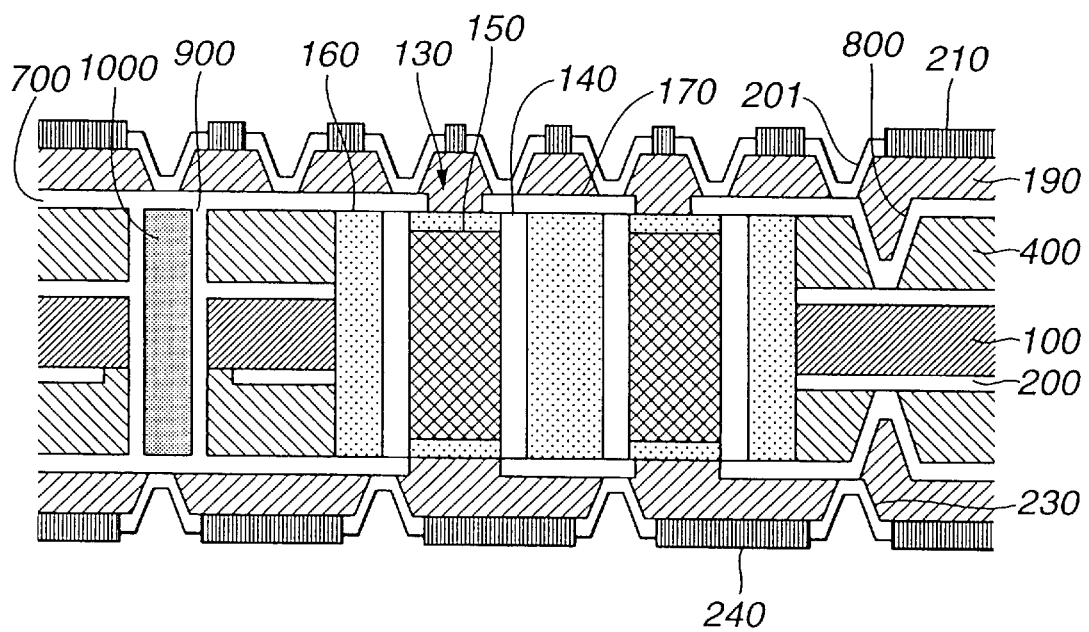
Figure 25:
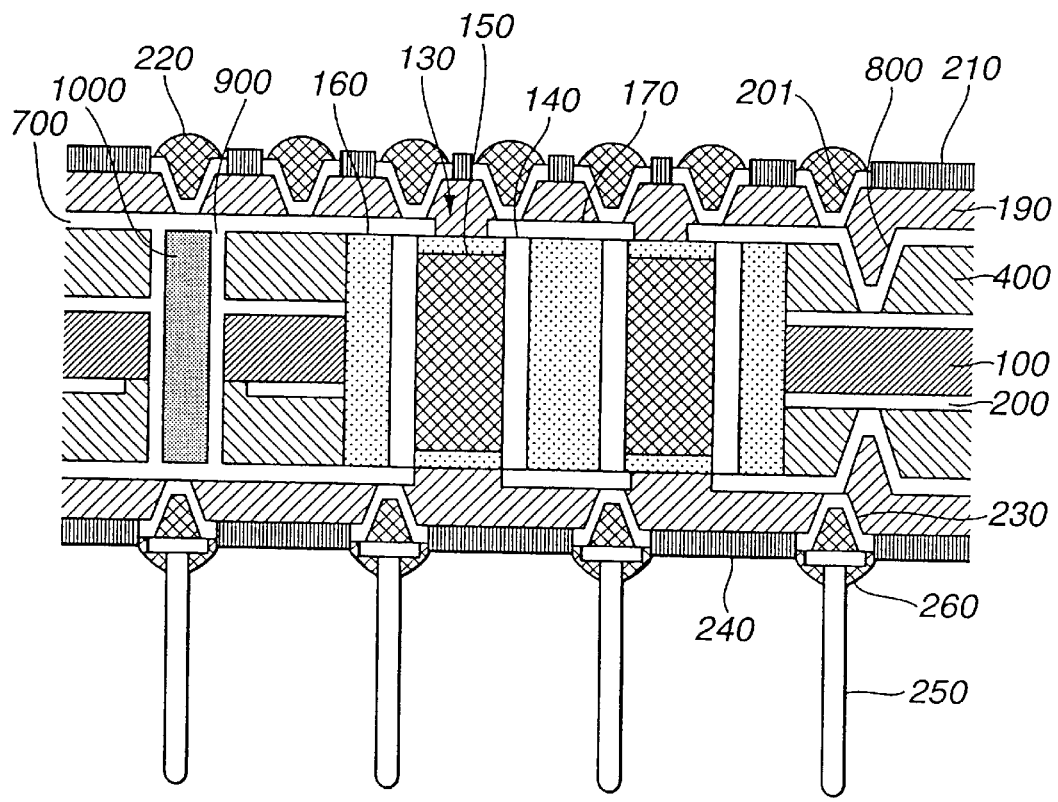

Then, an insulating film 190 is formed on the wiring layer, followed by its thermosetting. The resulting insulating layer 190 is irradiated with a carbon dioxide laser to form via holes for layer-to-layer connections. After that, the surface of the insulating layer 190 is made rough by using the same oxidizing agent as above, followed by forming a wiring layer 201 by the same procedures as above for forming the copper panel plating 700. Then, a dry film is formed on the wiring layer 201, followed by exposure and development of a mounting pattern of a semiconductor device, thereby completing formation of a solder resist layer 210. Similarly, a wiring layer 230 (having a predetermined pattern) and a solder resist layer 240 are formed on the other side of the substrate, as shown in FIG. 24.

Then, the terminal electrodes 201 for mounting a semiconductor device are subjected to Ni plating and then Au plating (not shown in the drawings), followed by printing a solder paste of a low-melting-point solder and then forming solder bumps 220 for mounting a semiconductor device by passing the substrate through a solder reflow furnace.

A solder paste of a high-melting-point solder is printed on the wiring layer 230, followed by forming solder bumps 260 (for attaching pins 250) by passing the substrate through the solder reflow furnace. Then, the pins 250 are attached to the solder bumps 260 by passing the substrate through the solder reflow furnace under a condition that the substrate is disposed on a jig (not shown in the drawings) having the pins 250 at their positions corresponding to the solder bumps 260, thereby obtaining a FC-PGA-type multilayer printed wiring substrate, which is prior to mounting thereon a semiconductor device.

Deviations of ends of some pins 250 (at positions corresponding to the through hole 110 filled with the resin) from predetermined positions were measured by using a projector. The results were 0.1 mm or less.

As is seen from FIG. 11, the semiconductor device is mounted on the wiring substrate by passing the substrate through the solder reflow furnace under a condition that the semiconductor device 270 is disposed at a position (for mounting thereon the semiconductor device 270) at a temperature dissolving only the low-melting-point solder. Then, an underfill material 300 is applied by a dispenser, followed by its thermosetting, thereby obtaining a semiconductor-mounted FC-PGA-type multilayer printed wiring board.

The electronic device may be selected from chip resistors, chip capacitors, and chip resistors. A ceramic-stacked electronic device is preferable, since it is possible to obtain a sufficient capacity even with a small size. It is possible that the end surface of each electrode 140 (on one side for mounting the semiconductor device 270) projects from the top surface of the stacked member 150 by a distance of 20–150 μm. It is preferable that both end surfaces of each electrode 140 project from both end surfaces of the stacked member 150 by a distance of 20–150 μm. With this, it becomes possible to fully fill a void space (between both electrodes) with the filling resin. If this projection is less than 20 μm, it may be difficult to fully fill the void space with the filling resin. If this projection is greater than 150 μm, the electrodes themselves may be broken off by stress, thereby making reliability inferior. The projection is more preferably 30–100 μm, still more preferably 50–80 μm. With this, it becomes possible to add an inorganic filler of a relatively large diameter, to have a good fluidity of the filling resin itself, and to have a smooth flow into a void space between the electronic device and the inner wall surface of the through hole.

The surface of each electrode of the electronic device has a roughness in a range of preferably 0.3–20 μm, more preferably 0.5–10 μm, still more preferably 0.5–5 μm, in terms of ten-point mean roughness, in order to anchor the filling resin to the electrode surface. The method for obtaining such roughness is not particularly limited. It can be obtained by a micro-etching method or blacking treatment.

By using a wiring circuit board according to the present invention, it is possible to mount a semiconductor device at a position that is generally above the electronic devices. This makes the substrate smaller in area. For example, it is possible to form a decoupling capacitor by embedding a chip condenser in the filling resin. With this, it becomes possible to shorten the wiring length from a power-supply layer and an earthing layer to the decoupling capacitor, thereby lowering inductance and effectively decreasing switching noise. In fact, the above-mentioned advantages can also be obtained if the semiconductor device electrodes are positioned generally above and electrically connected with the electronic device electrodes through the via conductors.

The following nonlimitative example is illustrative of the present invention.

EXAMPLE

As shown in Table 1, filling resins are prepared by weighing and mixing components and then by kneading the mixture with a roller mill (three rollers).

Particulars of Table 1 are as follows.

(1) Epoxy Resin:
   HP-4032D: Highly pure naphthalene-based epoxy resin made by Dainihon Ink Co.;
   E-807: Bisphenol F epoxy resin made by Yuka Shell Co.;
   YL-980: Bisphenol A epoxy resin made by Yuka Shell Co.; and
   E-152: Cresol novolak epoxy resin made by Yuka Shell Co.

(2) Curing Agent:
   QH-200: Acid anhydride curing agent made by Nippon Zeon Co.;
   B-570: Acid anhydride curing agent made by DIC Co.;
   B-650: Acid anhydride curing agent made by DIC Co;
   YH-306: Acid anhydride curing agent made by Yuka Shell Epoxy Co.;
   YH-307: Acid anhydride curing agent made by Yuka Shell Epoxy Co.; and
   LX1N: Modified amine curing agent made by Yuka Shell Epoxy Co.

(3) Curing Accelerator:
   2P4MHZ: imidazole curing accelerator made by Shikoku Kasei Kogyo Co.
   The curing accelerator is added in an amount of 0.5 wt %, based on the total of the epoxy resin and the inorganic filler.

(4) Inorganic Filler:
   TSS-6: Silica filler finished with a silane coupling treatment. This silica filler is made by Tatsumori Co., and its maximum particle size is 24 μm.

TABLE 1

| Sample No. | Epoxy Resin Product Name | Wt % | Curing Agent Product Name | Wt % | Inorganic Filler Product Name | Wt % | Vol. % | Curing Accelerator Product Name | Wt % |
|---|---|---|---|---|---|---|---|---|---|
| 1 | E-152 | 28 | QH-200 | 27 | TSS-6 | 45 | 31 | 2P4MHZ | 0.5 |
| 2 | E-807 | 25 | B-650 | 25 | TSS-6 | 50 | 35 | 2P4MHZ | 0.5 |
| 3 | E-807 | 25 | LX1N | 25 | TSS-6 | 50 | 35 | 2P4MHZ | 0.5 |
| 4 | HP-4032D | 21 | B-570 | 24 | TSS-6 | 55 | 40 | 2P4MHZ | 0.5 |
| 5 | HP-4032D | 19 | QH-200 | 21 | TSS-6 | 60 | 45 | 2P4MHZ | 0.5 |
| 6 | YL-980 | 19 | QH-200 | 16 | TSS-6 | 65 | 50 | 2P4MHZ | 0.5 |
| 7 | E-807 | 13 | YH-306 | 17 | TSS-6 | 70 | 56 | 2P4MHZ | 0.5 |
| 8 | E-152 | 11 | YH-307 | 14 | TSS-6 | 75 | 62 | 2P4MHZ | 0.5 |
| 9 | HP-4032D | 9 | QH-200 | 11 | TSS-6 | 80 | 69 | 2P4MHZ | 0.5 |

Test samples (wiring circuit boards) 1–9 are respectively prepared by using filling resins 1–9 shown in Table 1 in accordance with the present invention for conducting thereon first to third evaluation tests, as follows.

At first, a FR-5 core substrate (thickness: 0.8 mm) is punched by a mold to form a through hole of a predetermined size. Then, a back tape is attached to one side of the core substrate. Then, the core substrate is disposed in a manner that the back tape is under the core substrate proper. Then, a chip capacitor is placed at its predetermined position on the back tape in the through hole from the other side of the back tape using a chip mounter. Then, the through hole is filled with a filling resin (one selected from Samples 1–9 in Table 1) by using a dispenser.

Then, the filling resin is subjected to a thermosetting at 100° C. for 80 min, then 120° C. for 60 min, and then 160° C. for 10 min. After that, the surface of the cured resin is made flat by a rough grinding with a belt sander and then by a finish grinding through lapping. Then, a portion of the cured resin is removed by irradiating it with a carbon dioxide laser, thereby exposing electrodes of the chip capacitor and forming via holes.

Then, the surface of the resin is made rough by using a swelling liquid and KMnO4 solution. After that, the surface of the resin is subjected to a Pd catalyst activation, then electroless plating and then electroplating, thereby forming a copper plating layer (thickness: 35 μm). Then, a resist is formed on the plating layer, followed by removing an unnecessary portion of the copper plating layer using an etching solution ($Na_2S_2O_8$ and concentrated sulfuric acid) and then removing the remaining resist, thereby forming a predetermined wiring pattern including a test wiring pattern (width: 10 mm). The obtained preliminary test sample is subjected to the second evaluation test (i.e., measurement of adhesion strength of the test wiring pattern to the resin).

Then, a test sample for conducting thereon the third evaluation test is prepared from the preliminary test sample, as follows. An insulating film is formed on the preliminary test sample, followed by its thermosetting. The resulting insulating layer is irradiated with a laser to form a via hole for a layer-to-layer connection. After that, the surface of the insulating layer is made rough by using the surface same oxidizing agent as above, followed by forming a wiring layer by the same procedures as above for forming the copper plating layer. Then, a dry film is formed on the wiring layer, followed by exposure and development of a mounting pattern of a semiconductor device, thereby completing formation of a solder resist layer. Then, the terminal electrodes for mounting a semiconductor device are subjected to Ni plating and then Au plating. After that, the semiconductor device is mounted on the wiring substrate. Then, an underfill material is applied by a dispenser, followed by its thermosetting, thereby obtaining the test sample for conducting the third evaluation test.

(1) First Evaluation Test (evaluation of ten-point mean roughness (Rz))

An interface between the resin and the wiring layer was observed with a scanning electron microscope (SEM), and its photograph was taken with a magnification of 500. This photograph is enlarged by a factor of 4. A sectional curve of the interface is sampled from the enlarged photograph, and a ten-point mean roughness (Rz) of this sectional curve is determined in accordance with JIS B 0601. The reference length (1) is 0.16 mm. The results are shown in Table 2.

(2) Second Evaluation Test (evaluation of adhesion strength)

It is tried to pull off the test wiring pattern (width: 10 mm) from the resin by increasingly applying a force in a direction perpendicular to the substrate. At the moment when the test wiring pattern is pulled off, the applied force is recorded as adhesion strength. It can be judged that adhesion strength is preferably 0.4 kg/cm or greater, more preferably 0.6 kg/cm or greater. The results are shown in Table 2.

(3) Third Evaluation Test (reliability evaluation)

The obtained test sample is subjected to a heat cycle test (−55° C. to +125° C.) for 1,000 cycles and a pressure cooker test (PCT) (121° C., two atmospheres for 168 hr). Then, the surface and the section of the test sample are observed after theses tests with a loupe of 50 magnifications in order to check the existence of resin cracks near the chip capacitor, the existence of resin exfoliation, and the existence of other problems. If the test sample has these problems, it is judged as failure in this test. If the test sample is free from these problems, it is judged as pass in this test. The reliability test passing rate is expressed by percentage of the number of test samples passed in this test, based on the total number (i.e., 25) of test samples used in this test. In this manner, efficiency of the resin is evaluated. It can be judged that the reliability test passing rate is preferably 85% or greater. The results are shown in Table 2.

TABLE 2

| Sample No. | Ten-point Mean Roughness Rz (μm) | Adhesion Strength (kg/cm) | Reliability Test Passing Rate (%) |
|---|---|---|---|
| 1 | 1.5 | 0.35 | 75 |
| 2 | 2 | 0.4 | 88 |
| 3 | 2 | 0.4 | 85 |
| 4 | 2.5 | 0.6 | 100 |

TABLE 2-continued

| Sample No. | Ten-point Mean Roughness Rz (µm) | Adhesion Strength (kg/cm) | Reliability Test Passing Rate (%) |
|---|---|---|---|
| 5 | 4.8 | 0.75 | 100 |
| 6 | 4.1 | 0.6 | 95 |
| 7 | 5 | 0.45 | 90 |
| 8 | 6 | 0.4 | 85 |
| 9 | 6.5 | 0.35 | 70 |

It is understood from Table 2 that a good adhesion strength is obtained when ten-point mean roughness (Rz) is in a range of 2–6 vm and that a good reliability is obtained when the inorganic filler is in an amount of 35–65 volume %.

Furthermore, it is understood from Table 2 that, when the results of the test samples 4 and 6 are compared with each other, the test sample 4 (prepared by using a naphthalene-based epoxy resin) is equal to the test sample 6 (prepared by using a bisphenol-A epoxy resin) in adhesion strength and is better than the test sample 6 in reliability test, although the test sample 4 is less than the test sample 6 in ten-point mean roughness. Still furthermore, it is understood from Table 2 that, when the test results of the test samples 5 and 7 are compared with each other, the test sample 5 (prepared by using a naphthalene-based epoxy resin) is better than the test sample 7 (prepared by using a bisphenol-F epoxy resin) in adhesion strength and reliability test, although the test sample 5 is close to the test sample 7 in ten-point mean roughness. Thus, it is preferable to use a naphthalene-based epoxy resin as the filling resin.

It is understood from Table 2 that, when the test samples 2 and 3 are compared with each other, the test sample 2 is better than the test sample 3 in adhesion strength and reliability test, although the test samples 2 and 3 are the same in chemical composition except that an acid anhydride curing agent used for preparing the test sample 2 is replaced with a modified amine curing agent in preparing the test sample 3. Thus, it is preferable to use an acid anhydride curing agent for preparing the filling resin.

The entire disclosure of Japanese Patent Applications No. 2000-270088 (filed on Sep. 6, 2000) and No. 2001-68133 (filed on Mar. 12, 2001), including specification, drawings, claims and summary, is incorporated herein by reference in its entirety.

What is claimed is:

1. A wiring circuit board comprising:
   an electronic device disposed in a hole of said wiring circuit board;
   a resin filling said hole such that said electronic device is embedded in said resin; and
   a wiring layer formed on said resin, thereby forming an interface between said resin and said wiring layer,
   wherein said interface has a roughness in a range of 2–6 µm in terms of ten-point mean roughness.

2. A wiring circuit board according to claim 1, wherein said ten-point mean roughness is defined in Japanese Industrial Standard B 0601.

3. A wiring circuit board according to claim 1, wherein said ten-point mean roughness is a sum of (1) an average value of absolute values of heights of five highest profile peaks of a sampled portion of said interface and (2) an average value of absolute values of depths of five deepest profile valleys of said sampled portion of said interface.

4. A wiring circuit board according to claim 1, wherein said resin comprises 35–65 volume % of at least one inorganic filler.

5. A wiring circuit board according to claim 4, wherein said resin comprises 40–60 volume % of said at least one inorganic filler.

6. A wiring circuit board according to claim 5, wherein said resin comprises 40–50 volume % of said at least one inorganic filler.

7. A wiring circuit board according to claim 4, wherein said filler is selected from the group consisting of crystalline silica, fused silica, alumina, and silicon nitride.

8. A wiring circuit board according to claim 4, wherein said filler is made of particles having a particle size distribution in a range of 0.1–50 µm.

9. A wiring circuit board according to claim 8, wherein said particle size distribution is in a range of 0.3–30 µm.

10. A wiring circuit board according to claim 9, wherein said particle size distribution is in a range of 0.5–20 µm.

11. A wiring circuit board according to claim 4, wherein said filler is made of particles that are substantially spherical in shape.

12. A wiring circuit board according to claim 4, wherein said filler is treated with a coupling agent to conduct a surface treatment of said filler.

13. A wiring circuit board according to claim 1, wherein said resin comprises:
   a thermosetting resin that is at least one selected from the group consisting of bisphenol epoxy resins, naphthalene-based epoxy resins, and phenol-novolak resins;
   a curing agent for curing said thermosetting agent, said curing agent containing an acid anhydride as a component of said curing agent; and
   35–65 volume % of at least one inorganic filler.

14. A wiring circuit board according to claim 13, wherein said thermosetting resin is at least one naphthalene-based epoxy resin.

15. A wiring circuit board according to claim 13, wherein said resin further comprises a curing accelerator for accelerating curing of said thermosetting resin.

16. A wiring circuit board according to claim 1, further comprising:
   a core substrate including said hole that passes through said core substrate; and
   a buildup layer formed on at least one side of said core substrate, said buildup layer being formed of at least one insulating layer and at least one wiring layer that are alternately stacked together, said buildup layer overlapping with said hole in a direction along which said buildup layer is formed on said at least one side of said core substrate.

17. A wiring circuit board according to claim 1, wherein said roughness of said interface is in a range of 2.5–5 µm in terms of said ten-point mean roughness..

18. A method for producing a wiring circuit board, said wiring circuit board comprising:
   an electronic device disposed in a hole of said wiring circuit board;
   a resin filling said hole such that said electronic device is embedded in said resin;
   a wiring layer formed on said resin, thereby forming an interface between said resin and said wiring layer,
   wherein said interface has a roughness in a range of 2–6 µm in terms of ten-point mean roughness, said method comprising the steps of:
   (a) forming said hole in a core substrate of said wiring circuit board;
   (b) disposing said electronic device in said hole;

(c) filling said hole with a resin, thereby embedding said electronic device in said resin;
(d) making a surface of said resin rough; and
(e) forming said wiring layer on said surface of said resin.

19. A method according to claim 18, wherein said resin comprises:
   a thermosetting resin that is at least one selected from the group consisting of bisphenol epoxy resins, naphthalene-based epoxy resins, and phenol-novolak resins;
   a curing agent for curing said thermosetting agent, said curing agent containing an acid anhydride as a component of said curing agent; and
   35–65 volume % of at least one inorganic filler.

20. A method according to claim 19, further comprising, between the steps (c) and (d), the step of (f) curing said thermosetting resin by heating said core substrate at a temperature of 110–180° C.

21. A method according to claim 20, wherein the step (f) is conducted by heating said core substrate at a first temperature that is not lower than 80° C. and is lower than 120° C. and then at a second temperature that is not lower than 120° C. and is not higher than 180° C.

22. A method according to claim 18, wherein the step (d) is conducted by treating said surface of said resin with an oxidizing agent such that said interface has said roughness.

23. A method according to claim 18, further comprising, between the steps (d) and (e), the step of (g) activating said surface of said resin with a chemical liquid containing palladium chloride.

* * * * *